United States Patent [19]

Sprenkle et al.

[11] 3,944,311
[45] Mar. 16, 1976

[54] PRINTED CIRCUIT CARD INTERFACE APPARATUS

[75] Inventors: George J. Sprenkle, Phoenixville, Pa.; David A. Cicero, Collingswood, N.J.

[73] Assignee: Burroughs Corporation, Detroit, Mich.

[22] Filed: Sept. 4, 1974

[21] Appl. No.: 503,158

[52] U.S. Cl. .......................... 339/45 M; 339/75 MP
[51] Int. Cl.² .......................................... H01R 13/62
[58] Field of Search .......... 339/17 L, 17 LM, 17 M, 339/17 N, 45, 65 M, 75 MP, 176 MP; 317/101 DH

[56] References Cited
UNITED STATES PATENTS

| | | | |
|---|---|---|---|
| 2,976,510 | 3/1961 | Blain | 339/17 LM |
| 3,665,369 | 5/1972 | Ester | 339/176 MP |
| 3,692,966 | 9/1972 | Lancaster | 339/176 MP |
| 3,767,975 | 10/1973 | Glenn | 339/75 MP |

FOREIGN PATENTS OR APPLICATIONS

| | | | |
|---|---|---|---|
| 1,268,238 | 4/1968 | Germany | 339/176 MP |

*Primary Examiner*—Roy Lake
*Assistant Examiner*—Neil Abrams
*Attorney, Agent, or Firm*—Robert J. Gaybrick; Franklin D. Ubell; William B. Penn

[57] ABSTRACT

A fixture for interfacing electrical leads with the terminal edges of a printed circuit card, having a frame for supporting the card, a fixed connector for receiving one of the card's terminal edges and a movable connector slidably mounted on the frame and responsive to the operation of an actuating member for mating with the card's second terminal edge while simultaneously forcing mating of the fixed connector and first terminal edge. As mating occurs, resilient fingers mounted in conjunction with the second connector and previously cammed away from the card engage apertures in the card. These fingers serve to extract the card from the fixed connector when the movable connector is actuated away from the fixed connector toward a stop. At the stop, the fingers are cammed out of the apertures, and the progression of the card is halted while the movable connector continues its motion and thereby decouples from the then stationary second terminal edge.

13 Claims, 6 Drawing Figures

PRINTED CIRCUIT CARD INTERFACE APPARATUS

BACKGROUND OF THE INVENTION

This invention relates generally to apparatus for interfacing with a printed circuit card having a pair of opposite terminal edges bearing electrical conductors and more specifically to a fixture for coupling these terminal edges with sets of external electrical leads. The invention provides mechanical apparatus for supporting the card, simultaneously effecting connection to both its terminal edges and thereafter extracting the card from connection, all without manual handling of the card.

In the prior art, when it has been desired to attach a printed circuit card between two sets of electrical leads, for example for testing purposes, manual pushing and pulling of card leads have been employed. Even though simple extraction tools have been available for removing cards from the stationary connector blocks to which the leads are customarily attached, manual operations have still been required to insert cards and attach fixed and movable connector blocks.

Such manual manipulations produce several undesirable results. Most obviously, the somewhat jerky and uncontrollable hand movements entailed can damage cables, terminals and connectors and necessitate the use of excess cable when commonly used cable harness connectors are hand attached. Accommodating this excess cable and providing handroom contribute to excessive bulk, cumbersomeness and waste of space in areas where interfacing operations are carried out. Furthermore, cable harness connectors lying about in work areas are prone to damage, especially in tight quarters. Thus, efficient space allocation is thwarted and the electrical integrity of the elements involved impaired by manual interface techniques as heretofore known.

SUMMARY OF THE INVENTION

Accordingly, the invention contemplates the elimination of these prior art problems by providing compact mechanical means for securely supporting a printed circuit card and applying a smooth, controlled and evenly distributed force in effecting electrical connection to, and disconnection from, the card.

It is, therefore, an object of the invention to prevent damage to the components involved in printed circuit card interfacing operations.

It is another object of the invention to provide compact printed circuit card interfacing apparatus suitable for use in restricted areas and capable of easy assembly and disassembly for manufacturing and maintenance.

It is still another object of the invention to eliminate the necessity to manually interface printed circuit cards with electrical leads.

These and other objects and advantages are accomplished by disposing a printed circuit card in a frame so that one terminal edge lies opposite a fixed connector block while the second terminal edge lies opposite a second connector block slidably mounted on the frame. Upon actuation, the slidable connector moves toward the circuit card, ultimately forcing mating of both pairs of connectors and terminal edges. As mating occurs, resilient fingers mounted in conjunction with the movable connector and previously cammed out of the way engage the card. When it is desired to release the card, the movable connector is actuated away from the card, and the flexible fingers serve to extract the card away from the fixed connector. As the card progresses away from the fixed connector, the fingers are cammed out of engagement with the card as the card abuts a stop where it disengages from the still progressing movable connector.

BRIEF DESCRIPTION OF THE DRAWINGS

The foregoing objects and advantages of the invention, together with other advantages attainable by its use, will be apparent from the following detailed description of the invention read in conjunction with the drawings.

FIG. 4A shows the interface apparatus with a circuit card in place prior to activation. FIG. 4B shows an intermediate stage in the actuation of the apparatus in which the circuit card terminal edges have begun to engage the connectors of the apparatus.

FIG. 4C shows the apparatus at completion of connection to the circuit card terminal edges.

DETAILED DESCRIPTION OF THE PREFERRED EMBODIMENT

Figure 1:
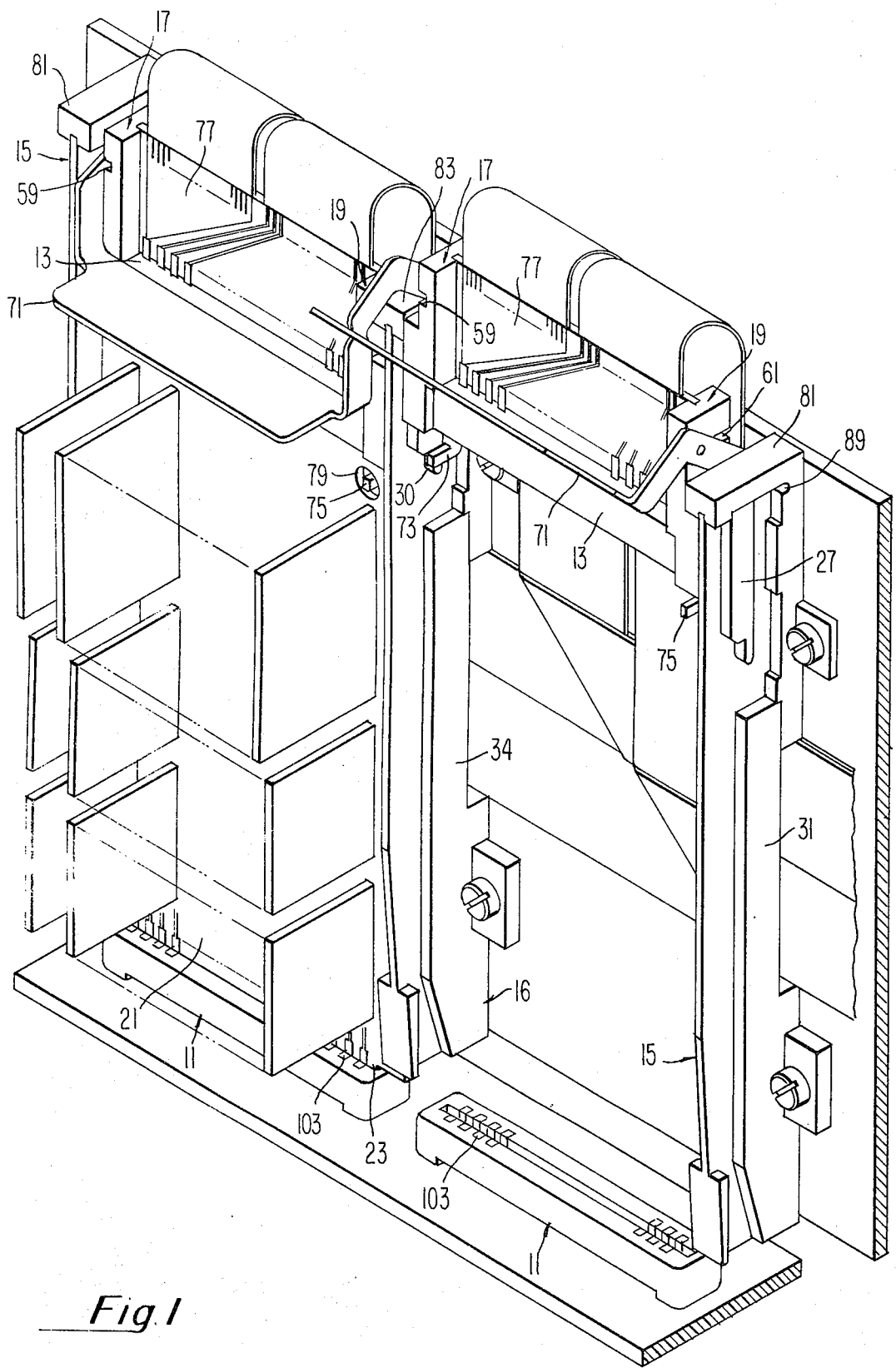
FIG. 1 is a view of an assembled bank of the interface apparatus of the preferred embodiment of the invention.

As shown generally in FIG. 1, the printed circuit card interface apparatus of the preferred embodiment of the invention includes a fixed connector block 11 and a movable connector block 13, which is slidably mounted on two slat-like frame members 15, 16 by means of two carrier members 17, 19. In addition to bearing the carrier members, 17, 19, the frame members 15, 16 are adapted to receive and support a printed circuit card 21 between the fixed and movable connector blocks 11, 13. After such a card 21 is inserted in the frame members 15, 16 and between the two connector blocks 11, 13, actuation of the movable block 13 and its associated carrier members 17, 19 will accomplish mating and unmating of the connector blocks 11, 13 with the terminal edges 23, 25 of the printed circuit card 21 as will be hereinafter detailed with reference to the structure of FIGS. 2 and 3.

Each of the slat-like frame members 15, 16 has identically shaped guide rails 27, 29, respectively, (FIGS. 2 and 3) for conducting and directing the translation of the slidable carrier members 17, 19 and identically shaped guideways 31, 33, which provide parallel linear edges 35, 37 for directing, positioning and supporting the printed circuit card 21. The guide rails 27, 29 and guideways 31, 33 are preferably formed as integral, bar-like projections on the frame members. Each guide rail has a stop 39, 41 for limiting the upward travel of the card 21 and a tongue extension 43, 45 for cooperating with resilient fingers 47, 49 of the carrier members 17, 19 as hereafter described.

Figure 2:
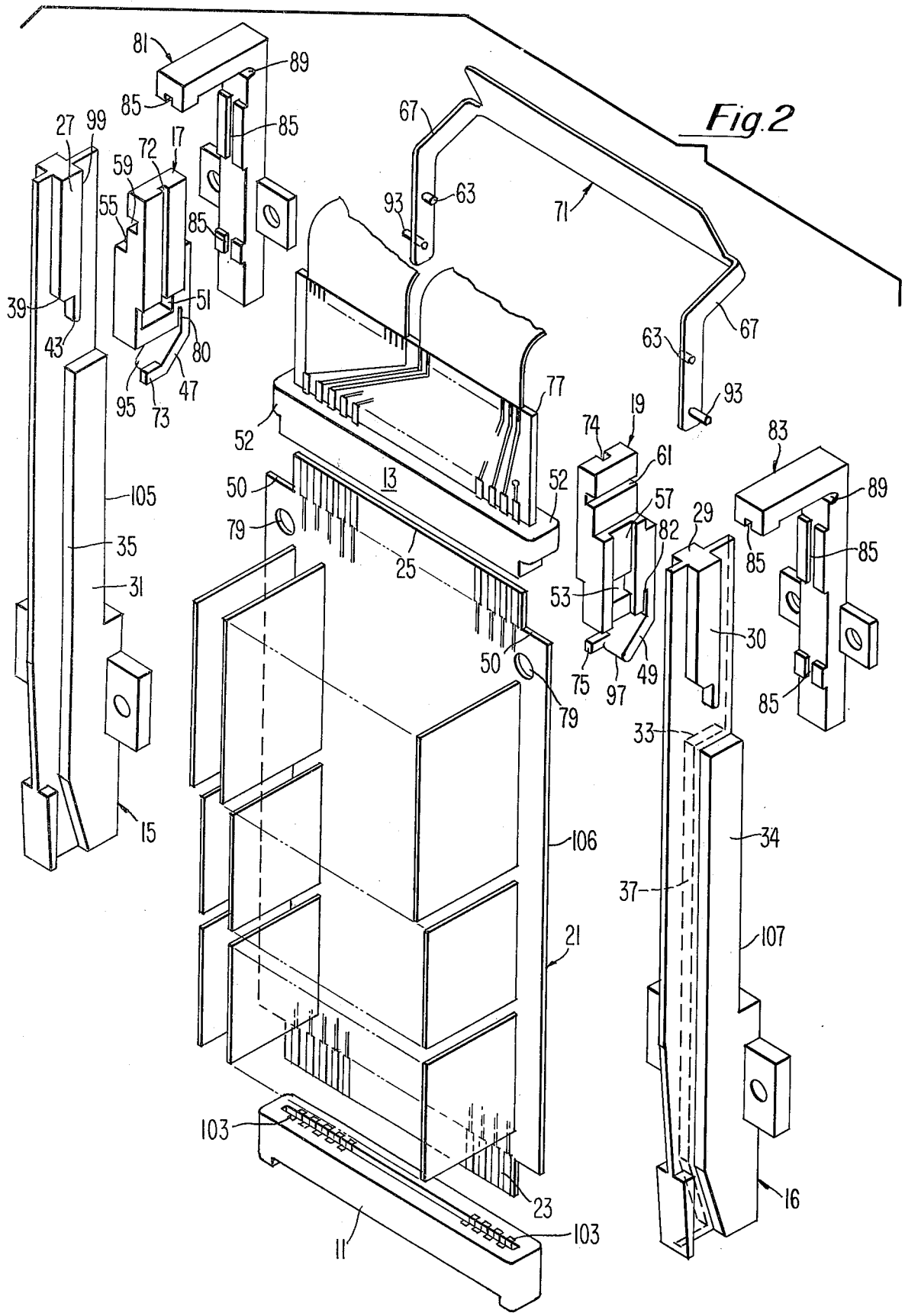
FIG. 2 is an exploded perspective view of a single unit of the preferred embodiment of the invention.
Figure 3:
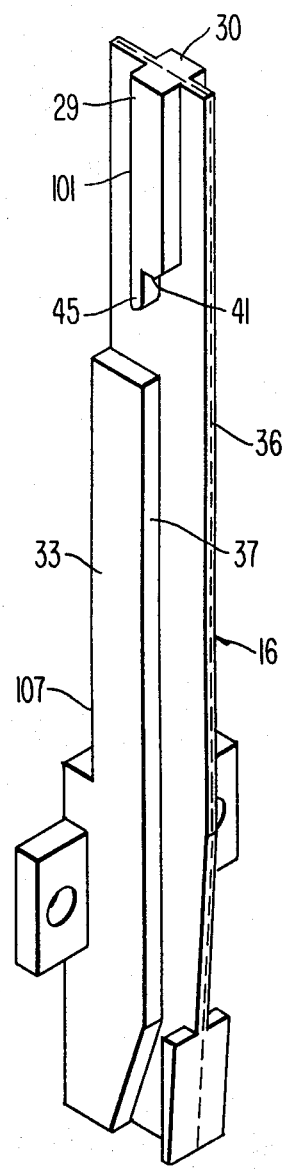
FIG. 3 is a view of the slat member 12 of FIG. 2 seen from a different perspective.

Up to this point, only the frame member structure necessary for cooperating with one printed circuit card 21 and one pair of carrier members 17, 19 has been described. However, each of the frame members 15, 16 may be constructed as illustrated in FIGS. 2 and 3 to have additional guideways and guide rails so that each frame member may cooperate with more than one carrier member in a bank of interface apparatus as shown in FIG. 1. The manner of so constructing each frame member will be described with particular reference to the frame member 16 shown in FIGS. 2 and 3.

The frame member 16 may have its associated guide rails 29, 30 and guideways 33, 34 formed identically to one another and positioned symmetrically about a plane cutting the slat in half along the dotted line 36 (FIG. 3) so that each guide-rail and guideway lies diametrically opposite its counterpart on the frame member 16. Constructing the other frame member 15 similarly renders the two frame members of the preferred embodiment of the invention identical and interchangeable.

It should be noted that the guide rails 27, 29, 30 and guideways 31, 33, 34 may be of shapes other than bar-like as long as such shapes provide surfaces which facilitate support of the printed circuit card 21 and promote linear translation between the connector blocks 11, 13 in a direction substantially parallel to the plane of the supported circuit card 21. Such other shapes could be symmetrically disposed as previously discussed in order to create interchangeable frame members.

As indicated, the carrier members 17, 19, which are structural mirror images of one another, interface between the frame guide rails 27, 29 and the movable connector block 13. The carrier members 17, 19 facilitate controlled translation of the connector block 13 toward and away from the fixed connector block 11. Furthermore, they grasp the printed circuit card 21 by means of the resilient fingers 47, 49 to assist in disconnecting the printed circuit card 21 from the connector blocks 11, 13.

To accomplish their interfacing and translationcontrolling functions, the carrier members 17, 19 are provided with openings 51, 53 for retaining the tongues 52 of the connector block 13; shoes 55, 57 for riding on the guide rails 27, 29 and slots 59, 61 for accommodating the driving pins 63 mounted on the inside of the legs 67 of a U-shaped actuating handle 71. The handle 71, which is secured for pivotal motion to the frame members 15, 16, constitutes the point of application of the external force which actuates the interface apparatus. This force is manually applied in the preferred embodiment but could be supplied by mechanical or other means not forming a part of the invention.

In order to facilitate disconnection of the printed circuit card 21, the carrier members 17, 19 are equipped with integrally formed resilient fingers 47, 49 each of which respectively bears a nipple 73, 75 for engaging apertures 79 in the printed circuit card 21 upon union of the terminal edges 23, 25 and connector blocks 11, 13. The flexure of these fingers is enhanced by slits 80, 82 extending into the bodies of the respective carrier members 17, 19.

The carrier members 17, 19 may be optionally provided with slots 72, 74 for accepting a terminal interface member 77. Though not essential to the invention, such a member 77 is often desirable for providing interconnection between a terminal block 13 such as shown and cable harness leads.

Finally, to facilitate mounting of the apparatus and securing of the U-shaped lever handle 71, identical and interchangeable, L-shaped, lightweight metal brackets 81, 83 are utilized. Each of these brackets 81, 83 has slots 85 for receiving and retaining one of the frame members 15, 16 respectively, and a groove 89 across the width of one of its legs for receiving and retaining one of the lever handle mounting pins 93, one of which is mounted on the outside of each of the legs 67 of the U-shaped lever handle 71.

The edges of the frame members 15, 16 are recessed slightly as at 105, 107, respectively, where they join the mounting brackets 81, 83 so that the back surfaces of the frame members 15, 16 and mounting brackets 81, 83 lie in a common plane when the members 15, 16 and mounting brackets 81, 83 are engaged and securely attached to an appropriate supporting surface. When the brackets 81, 83 and frame members 15, 16 are so engaged, the open faces of the grooves 89 are thereby sealed to securely retain the pins 93 and constrain them to pivotal motion.

Two particular advantages are inherent in the structure of the preferred embodiment of the invention as thus described.

First, the interlocking nature of the apparatus is such that no connection operations are required other than securely fastening the brackets 81, 83 and frame members 15, 16 to an appropriate surface and anchoring the fixed connector in position. When assembled, the movable connector block 13 fits in the openings 51, 53 in the two carrier members 17, 19 and urges the carrier members 17, 19 to ride on the guide rails 27, 29, (FIGS. 2 and 3). Conversely, the frame members 15, 16 act to prevent the movable connector block 13 from disengaging from the openings 51, 53 in the carrier members 17, 19. The carrier members 17, 19 are directly driven and further constrained by the pins 63 of the U-shaped lever handle pins 63, 93 position and guide handle 71. This interrelationship of elements effectively constrains their motion within the frame structure and determines the path of travel of both the carrier members 17, 19 and the actuating handle 71.

Figure 4A:
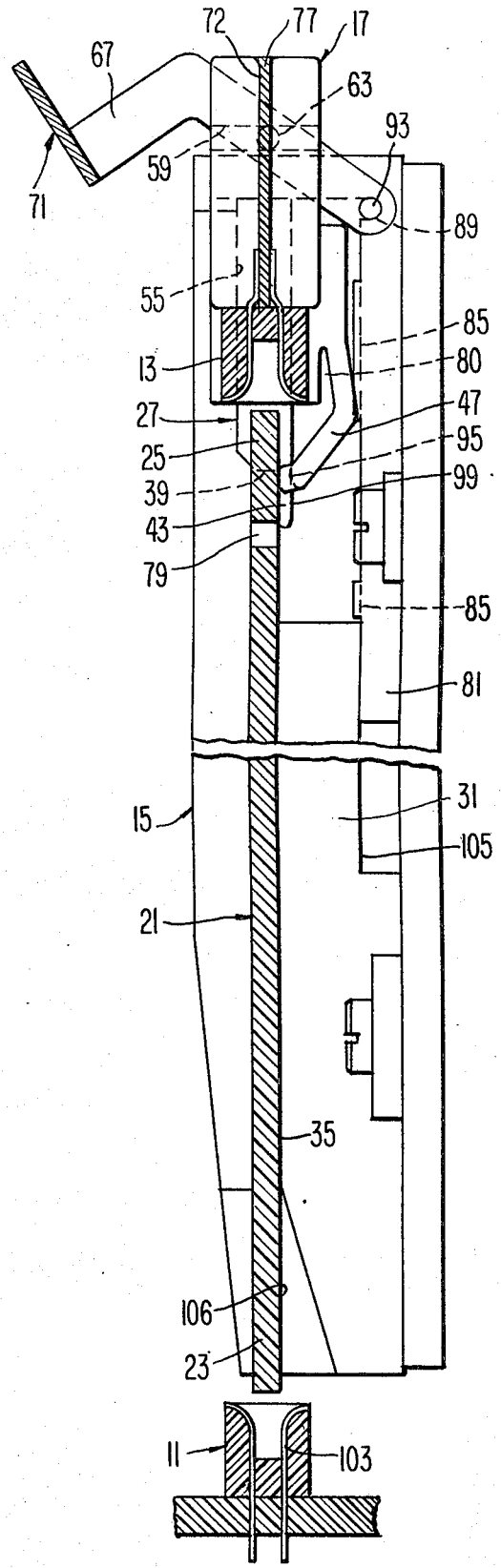
FIGS. 4A, 4B, 4C are cut away views showing the successive steps in the operation of the preferred embodiment of the invention.
Figure 4B:
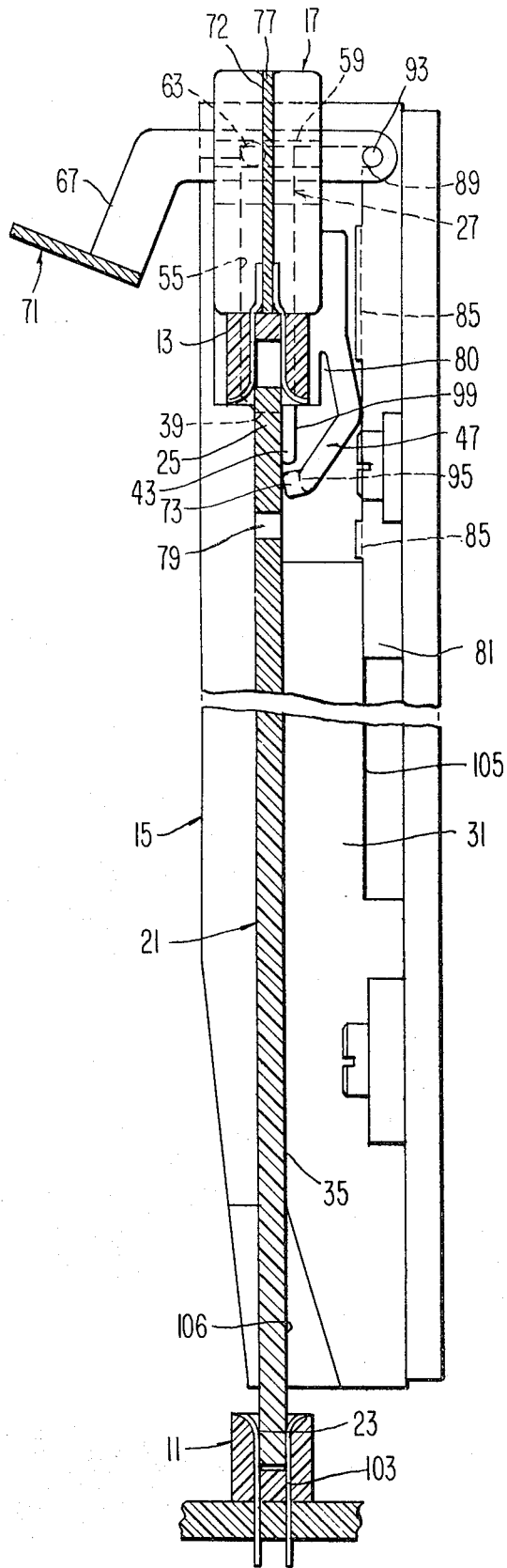

Secondly, the interchangeability of the frame members 15, 16, described above, together with the interlocking nature of the entire apparatus facilitates easy installment of banks of interface apparatus of the preferred embodiment employing a plurality of identical frame members 15, 16 as shown in FIG. 1. In such banks each printed circuit card 21 is sandwiched between a corresponding pair of slidable and fixed connectors constructed and mounted as already detailed and operated as hereafter described with particular reference to FIGS. 4A, 4B, and 4C.

To initiate operation of the interface apparatus of the preferred embodiment of the invention, a printed circuit card 21 is inserted onto the linear edges 35, 37 of the guideways 31, 33, such that the lower terminal edge 23 rests partially within the fixed connector block 11. The electrical contacts 103 of the fixed connector block 11 are narrowly but resiliently spaced so as to yield to movement of the terminal edge 23 into the interior of the block 11 only upon considerable pressure. In this position (FIG. 4A), the card's upper terminal edge 25 rests just below the movable connector block 13.

The actuating handle 71 is now rotated forward, producing driving forces at the driving pins 63. The horizontal component of force exerted at the pins 63 is expended by translation of the pins 63 along the horizontal carrier member slots 59, 61 while the vertical force component impels the carrier members 17, 19 along the guide rails 27, 29 toward the printed circuit card 21. At the outset of this motion (FIG. 4A), the tips 95, 97 of the resilient fingers 47, 49 follow the lower edges 99, 101 of the guide rails 27, 29, thereby retaining the nipples 73, 75 below the surface 106 of the circuit card 21.

As the carrier members translate toward the card (FIG. 4B), the movable connector block 13 approaches and begins to engage the card's upper terminal edge 25. As this engagement begins to occur, the circuit card reacts to the downward force on it and is impelled toward the fixed connector block 11, instituting engagement of the lower terminal edge 23 with the fixed connector block 11. During this initial connection stage, the finger tips 95, 97 reach the end of the tongue extensions 43, 45; and the nipples 73, 75 begin to ride against the underside of the circuit card 21 and approach the card apertures 79.

Figure 4C:
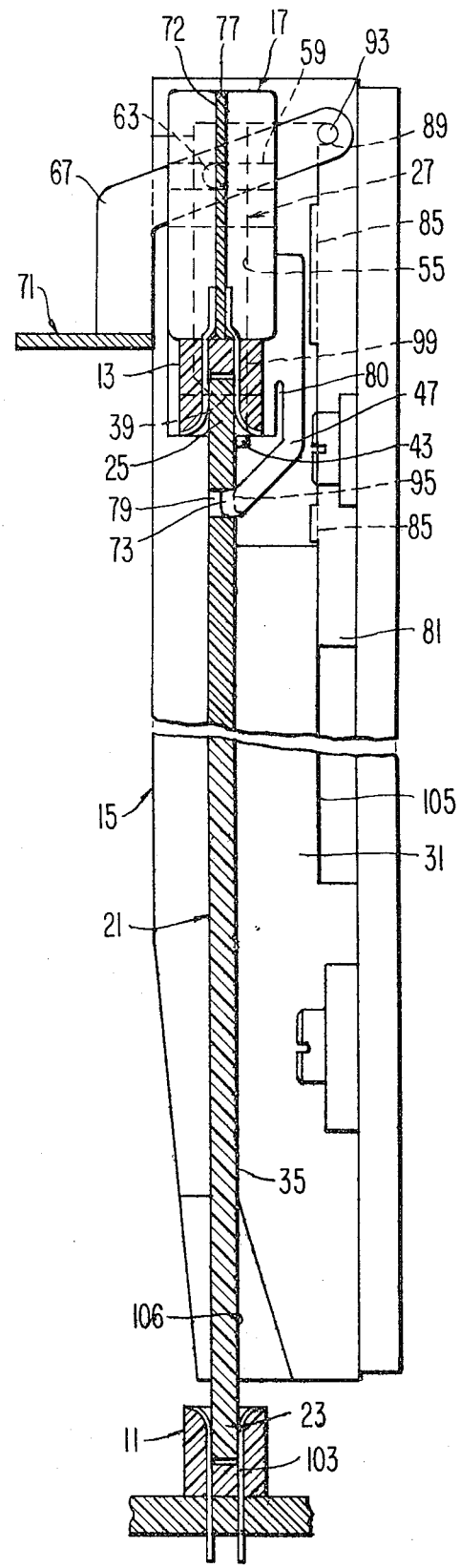

As illustrated in FIG. 4C, the lower limit of the path of travel of the movable connector block 13 is such that, as the lever handle 71 reaches the end of its trajectory, both connector blocks 11, 13 are completely engaged with the terminal edges 23, 25 of the printed circuit card 21. This limit is determined primarily by the dimensioning of the U-shaped handle 71 and the location of the driver pins 63 thereon. Furthermore, the length of the resilient fingers 47, 49 is so determined that at this position of complete engagement, the nipples 73, 75 pop into the card's apertures 79. At this point the mating operation is complete.

When it is desired to extract the card 21 from the connector blocks 11, 13 the lever handle 71 is actuated in the reverse direction. The resilient fingers 73, 75 grasp the board, preventing immediate disconnection of the upper terminal edge 25 from the movable connector block 13 and causing the lower terminal edge 23 to be pulled completely from the fixed connector block 11. After disconnection of the lower terminal edge 23 and as the card 21 continues away from the fixed block 11, the upper corners 50 of the card 21 abut the two stops 39, 41 (FIGS. 2 and 3).

At this point, the finger tips 47, 49 encounter the tongues 43, 45 of the guide rails 27, 29 and are cammed away from the circuit card 21, thereby disengaging the nipples 73, 75 from the apertures 79. The circuit card is now prevented from further upward travel by the stops 39, 41 while the carrier members 17, 19 and movable connector block 13 are free to continue translation. Further reverse movement of the actuating lever handle 71 therefore pulls the movable connector block 13 away from the temporarily stationary upper terminal edge 25, completely freeing the board from the interface apparatus.

At this juncture, a particularly advantageous and convenient embodiment of the present invention for accomplishing interface operations with a printed circuit card has been described. Obviously, many otther variations and modifications of the present invention are possible in light of the teachings above, and it is therefore to be understood that, within the scope of the appended claims, the invention may be practiced otherwise than as specifically described.

What is claimed is:

1. A fixture for interfacing first and second sets of electrical leads with first and second opposite terminal edges, respectively, of a card bearing electrical circuitry, said fixture comprising:

first electrical connector means connected to said first set of leads for mating with said first terminal edge of said card;

second electrical connector means connected to said second set of leads for mating with said second terminal edge of said card;

frame means for receiving and slidably supporting said card between said first and second electrical connector means;

means supporting said second electrical connector means for movement along said frame means;

means on said frame means to guidingly support said supporting means for said second electrical connector means for movement along said frame means; and actuatable means secured to said frame means and to said means supporting said second electrical connector means and movable in one direction for displacing said second electrical connector means in a first increment of movement to abut said card and move same along said frame means toward said first electrical connector means to cause a mating of said first electrical connector means and said first terminal edge, said actuatable means displacing said second electrical connector means in a second increment of movement to effect the mating of said second electrical connector means and said second terminal edge.

2. The interface fixture of claim 1 wherein said actuatable means is pivotally secured to said frame means and movable in a second direction for displacing said second electrical connector means away from said first electrical connector means.

3. The interface fixture of claim 2 wherein said second electrical connector means includes engaging means cooperating with said card upon the mating of said second electrical connector means and said second terminal edge for withdrawing said first terminal edge from said first electrical connector means during the displacement of said second electrical connector means away from said first electrical connector means when said actuatable means is moved in said second direction.

4. The interface fixture of claim 3 wherein said frame means includes means for disengaging said engaging means from said card after the withdrawal of said first terminal edge from said first electrical connector means during the movement of said second electrical connector means away from said first electrical connector means.

5. The interface fixture of claim 4 wherein said frame means further includes means for effecting a disconnection of said second electrical connector means from said second terminal edge subsequent to said disengaging of said engaging means from said card.

6. The interface fixture of claim 5 wherein said means for disconnecting said second electrical connector means from said second terminal edge comprises:

stop means mounted on said frame to abut and constrain the travel of said card along said frame means and away from said first electrical connector means.

7. The interface fixture of claim 5 wherein said frame means comprises:

first and second parallel members; and said means for supporting said card comprises guideway means on each of said parallel members; and wherein said means on said frame guidingly supporting said supporting means comprises guide rail means on each of said parallel members disposed in a line with said first and second guideway means, respectively, and adjacent said second terminal edge of said card.

8. The interface fixture of claim 7 wherein said means for automatically engaging said card comprises:
first and second apertures in said card; and
resilient finger means attached to each of said carrier members for engaging said first and second apertures.

9. The interface fixture of claim 7 wherein said first parallel member has disposed about it a pair of identical, integrally formed and diametrically opposed guiderail means and a pair of identical, integrally formed and diametrically opposed guideway means; and wherein said second parallel member is identical to said first parallel member and has a pair of said guide rail means and a pair of said guideway means formed and disposed thereon in a manner identical to said first parallel member, thereby forming two identical and interchangable frame members.

10. The interface fixture of claim 7 wherein said means supporting said second electrical connector comprises:
first and second carrier members slidably mounted on said guide rail means of said first and second parallel members, respectively; each of said carrier members having an opening for retaining said second electrical connector means at a position adjacent said second terminal edge.

11. The interface fixture of claim 10 wherein said means for automatically disengaging said engaging means comprises:
a tongue extension from each of said guide rail means contoured for camming said finger means out of the travel path of said card and out of said apertures after said card is withdrawn from said first electrical connector means.

12. The interface fixture of claim 11 wherein said tongue extension also cams said finger means out of the travel path of said card prior to engagement of said finger means and said apertures.

13. The interface fixture of claim 12 wherein said actuating means comprises:
a slot in each of said first and second carrier members perpendicular to the path of travel of said carrier members;
a bearing surface in each of said parallel members; and
a U-shaped lever handle having a first pin on the outside of each leg, each for pivotably engaging one of said bearing surfaces and a second pin on the inside of each leg, each pin engaging one of said slots.

* * * * *